United States Patent
Lian et al.

(10) Patent No.: US 11,421,977 B2
(45) Date of Patent: Aug. 23, 2022

(54) ELIMINATING INTERNAL REFLECTIONS IN AN INTERFEROMETRIC ENDPOINT DETECTION SYSTEM

(71) Applicant: Applied Materials, Inc., Santa Clara, CA (US)

(72) Inventors: Lei Lian, Fremont, CA (US); Pengyu Han, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/165,544

(22) Filed: Oct. 19, 2018

(65) Prior Publication Data

US 2020/0124399 A1 Apr. 23, 2020

(51) Int. Cl.
    *G01B 9/02056* (2022.01)
    *G01B 11/06* (2006.01)
    *H01L 21/67* (2006.01)
    *H01J 37/32* (2006.01)

(52) U.S. Cl.
    CPC ...... *G01B 9/02059* (2013.01); *G01B 11/0683* (2013.01); *H01J 37/32458* (2013.01); *H01J 37/32963* (2013.01); *H01L 21/67069* (2013.01); *H01L 21/67253* (2013.01); *H01J 2237/334* (2013.01)

(58) Field of Classification Search
    CPC ............ G01B 9/02059; G01B 11/0683; H01J 37/32963; H01L 21/67253
    See application file for complete search history.

(56) References Cited

U.S. PATENT DOCUMENTS

| | | | | |
|---|---|---|---|---|
| 5,773,316 A | * | 6/1998 | Kurosaki | B24B 37/013 257/E21.528 |
| 6,390,019 B1 | * | 5/2002 | Grimbergen | H01J 37/32458 118/723 R |
| 6,712,927 B1 | * | 3/2004 | Grimbergen | H01J 37/321 156/345.24 |
| 6,758,941 B1 | * | 7/2004 | Ookawa | H01J 37/32082 118/723 E |
| 7,306,696 B2 | | 12/2007 | Lian et al. | |
| 8,257,546 B2 | | 9/2012 | Davis et al. | |
| 8,956,886 B2 | | 2/2015 | Banna et al. | |
| 9,601,396 B2 | | 3/2017 | Lian | |
| 2004/0004724 A1 | * | 1/2004 | Kim | G01B 11/0625 356/504 |
| 2007/0023393 A1 | * | 2/2007 | Nguyen | H01J 37/321 216/60 |
| 2014/0118751 A1 | * | 5/2014 | Rajagopalan | C23C 16/5096 356/630 |
| 2017/0068163 A1 | | 3/2017 | Laidig et al. | |

* cited by examiner

*Primary Examiner* — Michael P LaPage
(74) *Attorney, Agent, or Firm* — Patterson + Sheridan, LLP

(57) ABSTRACT

A method is disclosed for operating an endpoint detection system of a processing chamber having a ceiling formed therein, a substrate support located internal to the processing chamber, and a substrate resting on the substrate support. A transparent panel is located in the ceiling of the processing chamber, the panel oriented at a first acute angle relative to the substrate and the substrate support. The transparent panel receives an incident light beam from the endpoint detection system at a second acute angle relative to the panel. The transparent panel transmits the incident light beam to the substrate within the processing chamber at an angle perpendicular to the substrate and the substrate support.

9 Claims, 9 Drawing Sheets

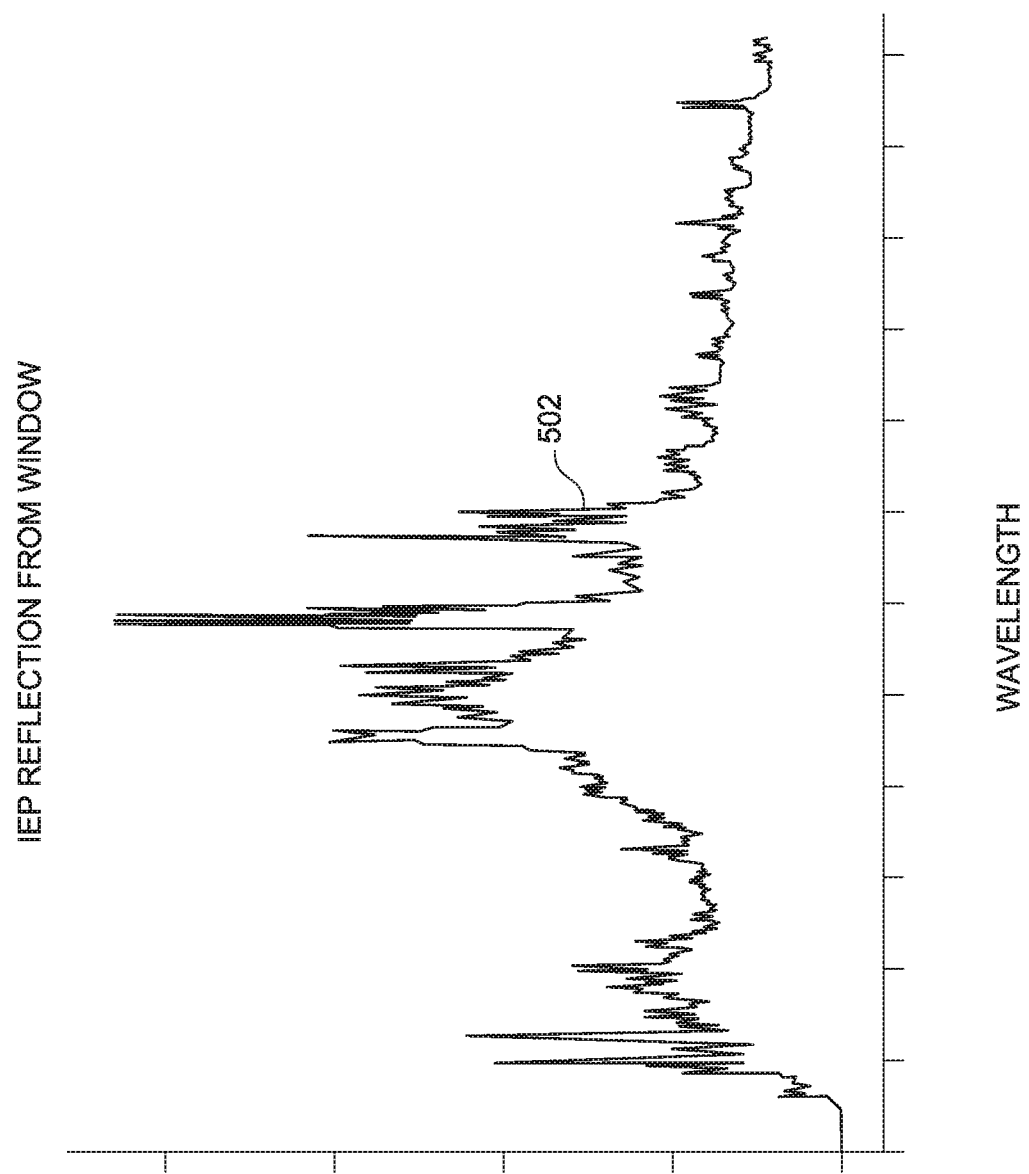

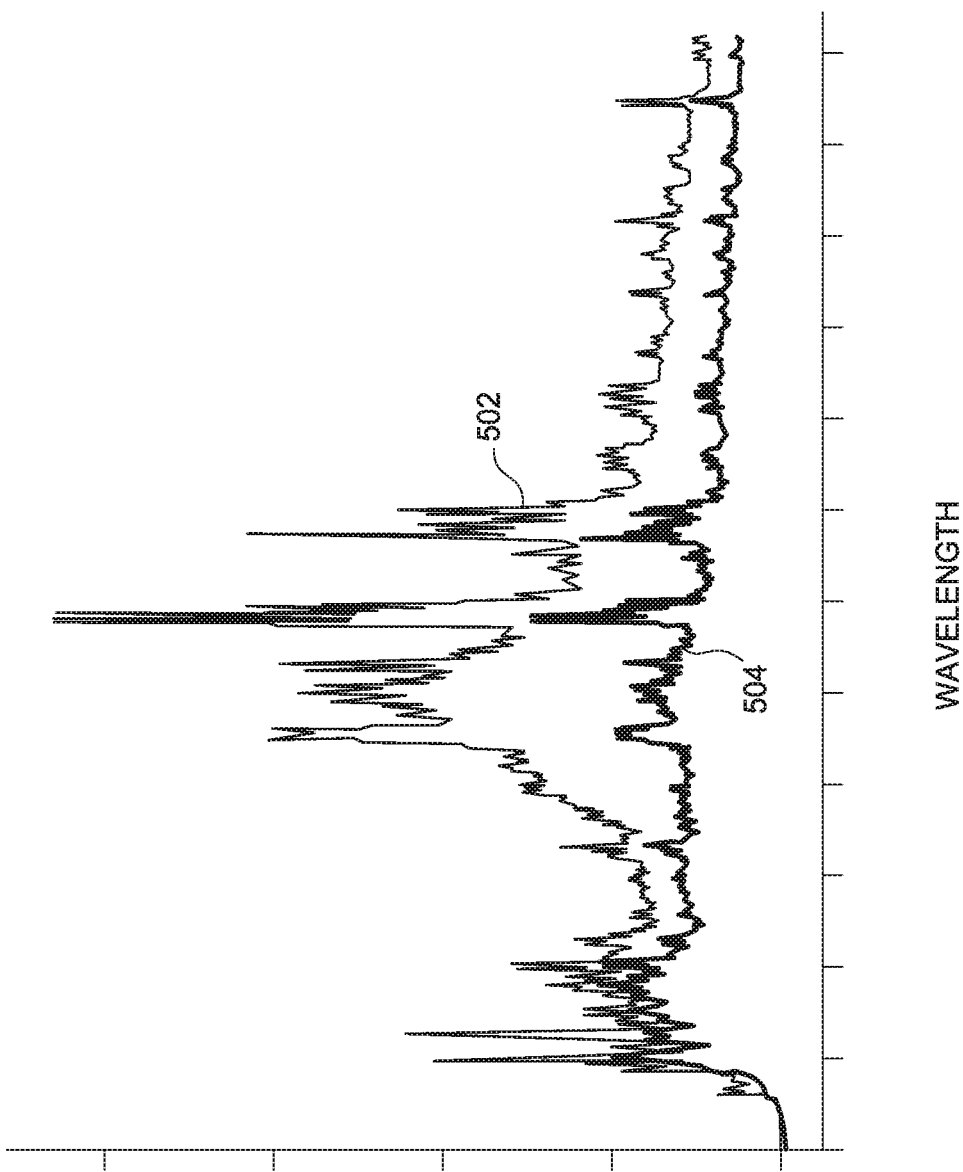

ELIMINATING INTERNAL REFLECTIONS IN AN INTERFEROMETRIC ENDPOINT DETECTION SYSTEM

BACKGROUND

Field

Embodiments of the present disclosure generally relate to endpoint detection for semiconductor processing, and more particularly, to an endpoint detection system and method having reduced reflections of incident and reflected light.

Description of the Related Art

Semiconductor device geometries have dramatically decreased in size since such devices were first introduced several decades ago. The increasing circuit densities have placed additional demands on processes used to fabricate semi-conductor devices. For example, as circuit densities increase, the pitch size decreases rapidly to sub 50 nm dimensions, whereas the vertical dimensions such as trench depth remain relatively constant, with the result that the aspect ratios for the features, i.e., their height divided by width, increases. Precise control of the dimensions of such high density and sub-micron features is critical to the reliable formation of the semiconductor devices.

Semi-conductor devices such as transistors and capacitors are conventionally formed by patterning a surface of a substrate to define the lateral dimensions of the features and then etching the substrate to remove material and define the features. To form features with a desired electrical performance, the dimensions of the features must be formed within control specifications. Consequently, precise patterning and subsequent etching of the substrate is critical to reliable formation of features with desired critical dimensions.

In integrated circuit manufacturing, it is necessary to structure layers to form the high density semiconductor devices. Accordingly, it may be necessary to partially remove one or more layers using a dry etching or plasma etching process. During plasma etching, a mask is utilized to transfer a pattern to a target layer disposed on a substrate without etching a layer disposed underlying the target layer. To partially etch the underlying layer or substrate to the target depth or thickness, interferometric endpoint techniques are utilized. Interferometry endpoint systems uses interference of reflected light waves reflected off different interfaces at the wafer surface to recognize the change in etch depth or film thickness of a surface.

An interferometer measures the difference of two or more light paths by overlapping the residual light from both paths, generating interference fringes. A monochromatic or broadband light source is used and reflected from the surface of the complex film stack. Small changes in the range of the light source wavelength can be recognized.

The reflected light is a combination of signals from each layer disposed on the substrate and special interference fringes are formed for each layer. For end point detection, the interference fringe pattern can be simulated for various layers and then compared during etching with the measured signal. The method is very effective and can be used for monitor etching or deposition and end point detection of substrates with multiple layers on top.

Transmitted and reflected light generally passes through a generally flat, transparent window in a plasma etch chamber with incidence view of the substrate being etched. Unfortunately, conventional flat interferometry endpoint (IEP) detection windows encounter significant internal reflection and reduced sensitivity to on-substrate metrics while etching. A typical approach to reducing internal reflections in the IEP window is to employ anti-reflective coatings (ARC) at surfaces of the window. Unfortunately, ARCs only work over a limited range of wavelengths when it is necessary to remove internal reflections over a broad range of wavelengths, generally from 200 nm to 800 nm.

Therefore, a need exists in the art for an effective way to eliminate internal reflection for an endpoint detection system.

SUMMARY

Embodiments presented herein provide a method for operating an endpoint detection system, a transparent panel for the endpoint detection system, and a processing chamber having the same. The processing chamber has a ceiling formed therein, a substrate support located internal to the processing chamber, and a substrate resting on the substrate support. The transparent panel is located in the ceiling of the processing chamber, the panel oriented at a first acute angle relative to the substrate and the substrate support. The transparent panel receives an incident light beam from the endpoint detection system at a second acute angle relative to the panel. The transparent panel transmits the incident light beam to the substrate within the processing chamber at an angle perpendicular to the substrate and the substrate support.

Embodiments presented herein further provide a processing chamber. The processing chamber includes a chamber body having sidewalls and a bottom. A ceiling is mounted overlying the chamber body, the ceiling and the chamber body defining an inner space of the processing chamber. A substrate support is disposed in the inner space of the processing chamber and configured to support a substrate during processing. The chamber further comprises an endpoint detection system. The chamber further comprises a transparent panel mounted in the ceiling and configured to allow the endpoint detection system to interface with the substrate through the transparent panel, the transparent panel oriented at a first acute angle relative to the substrate and the substrate support. The transparent panel is configured to receive an incident light beam from the endpoint detection system at a second acute angle relative to the panel. The transparent panel is further configured to transmit the incident light beam to the substrate within the processing chamber at an angle perpendicular to the substrate and the substrate support.

Embodiments presented herein further provide a tilted window suitable for use in an endpoint detection system of a processing chamber. The tilted window comprises a mounting frame having a body comprising a first section and a second section extending perpendicular from the first section. The second section has an upper surface and a bottom surface, an upper surface of the second section tilted at a first acute angle relative to the a bottom surface of the second section and tilted at a second acute angle relative to the first section. The tilted window further comprises a panel having a body comprising a top surface, a bottom surface, and a sidewall, the panel disposed in the mounting frame. The sidewall of the panel adjacent is to the first section of the mounting frame and the bottom surface of the panel resting on the upper surface of the second section of the mounting frame oriented at the first acute angle relative to the bottom surface of the second section of the mounting frame.

Embodiments presented herein further provide a processing chamber. The processing chamber includes a chamber body having sidewalls and a bottom. A ceiling is mounted overlying the chamber body, the ceiling and the chamber body defining an inner space of the processing chamber. A substrate support is disposed in the inner space of the processing chamber and configured to support a substrate during processing. The chamber further comprises an endpoint detection system. The chamber further comprises a tilted window mounted in the ceiling and configured to allow the endpoint detection system to interface with the substrate through the tilted window. The tilted window comprises a mounting frame having a body comprising a first section and a second section extending perpendicular from the first section. The second section has an upper surface and a bottom surface, an upper surface of the second section tilted at a first acute angle relative to the a bottom surface of the second section and tilted at a second acute angle relative to the first section. The tilted window further comprises a panel having a body comprising a top surface, a bottom surface, and a sidewall, the panel disposed in the mounting frame. The sidewall of the panel is adjacent to the first section of the mounting frame and the bottom surface of the panel resting on the upper surface of the second section of the mounting frame oriented at the first acute angle relative to the bottom surface of the second section of the mounting frame.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5A is a plot of reflection magnitude versus wavelength for a conventional window.

FIG. 5B is a comparison between a plot of reflection magnitude versus wavelength for a conventional window and that of a tilted window.

Figure 1:
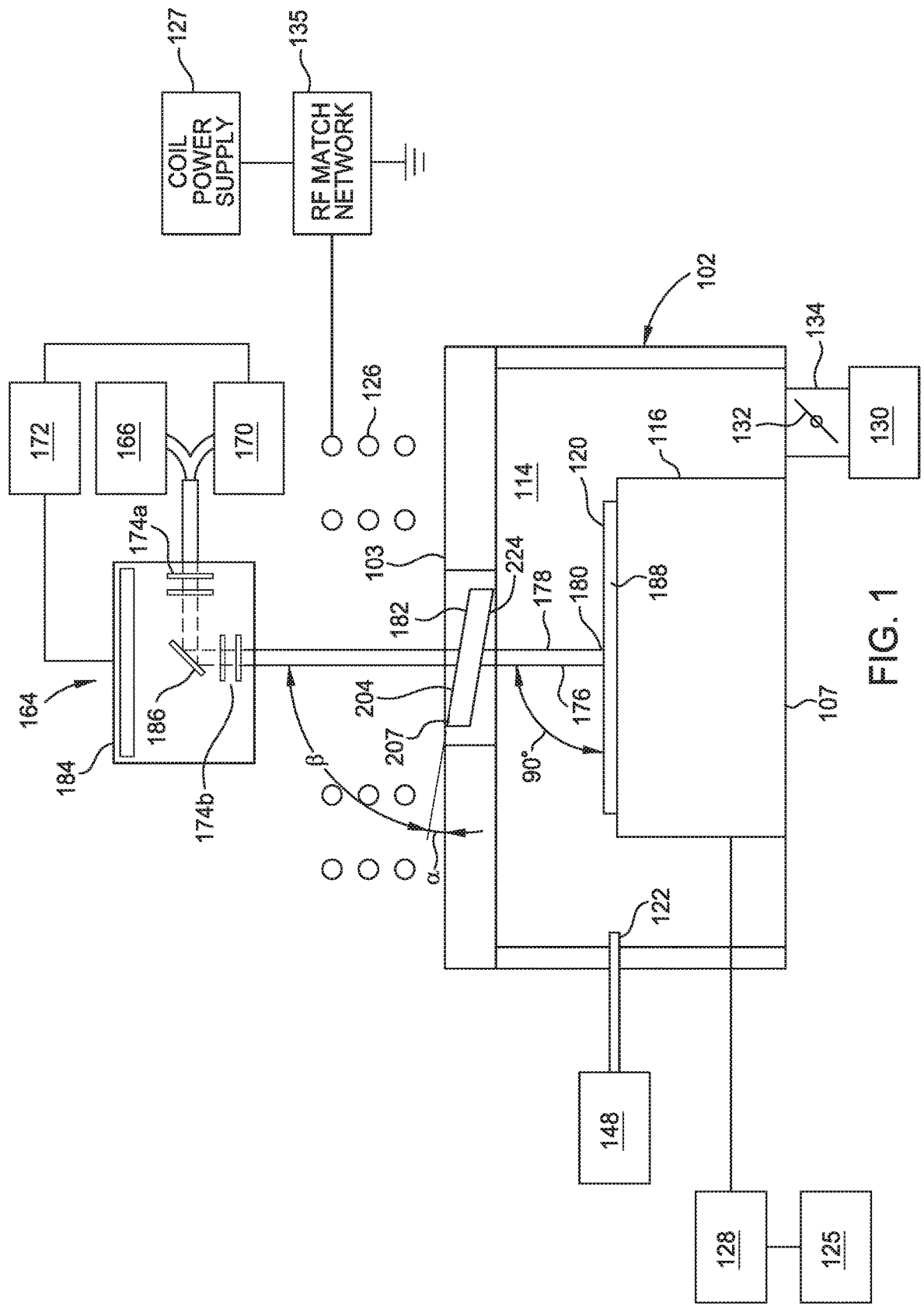
FIG. 1 illustrates a schematic cross sectional view of a plasma etch chamber in accordance with one embodiment of the present disclosure.

To facilitate understanding, identical reference numerals have been used, wherever possible, to designate identical elements that are common to the Figures. Additionally, it is contemplated that elements disclosed in one embodiment may be beneficially used in other embodiments described herein without specific recitation.

DETAILED DESCRIPTION

The titled window presented herein can effectively reduce internal reflections over a wide range of wavelengths of interest, such as between about 200 to 800 nm, without the need of anti-reflection coatings. The dynamic range of the IEP system is improved. The direct benefits of the tilted window are improved etch depth and thickness control accuracy and extended window service life. The tilted window is generally compatible with existing chamber bodies, and as such, may be retrofit into almost all existing plasma processing chambers that utilize IEP systems.

FIG. 1 is a schematic cross sectional view of a plasma processing chamber 100 in accordance with one embodiment of the present disclosure. Suitable processing chambers include inductively and capacitive coupled plasma etch chambers such as the SYM3® etch system, available from Applied Materials, Inc., of Santa Clara, Calif., among others. Other types of processing chambers may be adapted to benefit from the invention, including, for example, chemical vapor deposition chambers, capacitive coupled parallel plate chambers and magnetically enhanced ion etch chambers, as well as inductively coupled plasma etch chambers of different designs.

The processing chamber 100 generally includes a chamber body 102 and an energy transparent ceiling 103. The chamber body 102 also has a chamber bottom 107. The chamber body 102 is fabricated from a metal, such as anodized aluminum or stainless steel. The ceiling 103 mounted on the body 102. The ceiling 103 may be flat, rectangular, arcuate, conical, dome or multi-radius shaped. The ceiling 103 is fabricated from an energy transparent material such as a ceramic or other dielectric material. An inductive coil 126 is disposed over the ceiling 103 of the processing chamber 100, and is utilized to energize gases within the chamber 100 during processing.

A substrate support 116 is disposed in the processing chamber 100 having a substrate support surface 188 to support a substrate 120 during processing. The substrate support 116 may include an electrostatic chuck, with at least a portion of the substrate support 116 being electrically conductive and capable of serving as a process bias cathode.

Processing gases are introduced into the processing chamber 100 from a process gas source 148 through a gas distributor 122. The gas distributor 122 may be disposed in the ceiling 103 or chamber body 102, generally above the substrate support 116. Mass flow controllers (not shown) for each processing gas, or alternatively, for mixtures of the processing gas, are disposed between the gas distributor 122 and the process gas source 148 to regulate the respective flow rates of the process gases into the chamber body 102.

A plasma zone 114 is defined in the chamber body 102 between the substrate support 116 and the ceiling 103. A plasma is formed in the plasma zone 114 from the processing gases using a coil power supply 127 which supplies power to the inductive coil 126 to generate an electromagnetic field in the plasma zone 114 through an RF match network 135. The substrate support 116 may include an electrode disposed therein, which is powered by an electrode power supply 128 and generates a capacitive electric field in the processing chamber 100 through an RF match network 125. Typically, RF power is applied to the electrode in the substrate support 116 while the body 102 is electrically grounded. The capacitive electric field is transverse to the plane of the substrate support 116, and influences the directionality of charged species more normal to the substrate 120 to provide more vertically oriented anisotropic etching of the substrate 120.

Process gases and etchant byproducts are exhausted from the processing chamber 100 through an exhaust system 130. The exhaust system 130 may be disposed in the bottom 107 of the processing chamber 100 or may be disposed in another portion of the body 102 of the processing chamber 100 for removal of processing gases. A throttle valve 132 is provided in an exhaust port 134 for controlling the pressure in the processing chamber 100.

FIG. 1 further illustrates an endpoint detection system 164 connected to the processing chamber 100. The endpoint detection system 164 may be an interferometer endpoint (IEP) detection system. The endpoint detection system 164 is positioned to interface with the substrate 120 through a portion of the ceiling 103. In one example, the endpoint detection system 164 is positioned to interface a peripheral portion of the substrate through a portion of the ceiling 103 that is offset from the center of the ceiling 103. In this manner, the endpoint detection system 164 has a direct line of sight to detect a peripheral region surface of the substrate 120.

The endpoint detection system 164 generally comprises a light source 166, a collimating assembly 168, and a light detector 170. The light source 166 is configured to emit a light beam. The collimating assembly 168 is configured to focus the light beam into an incident light beam 176. The incident light beam 176 passes through the ceiling 103 in a direction perpendicular to a substrate support surface 188 and illuminate an area or spot 180 on the surface of the substrate 120. The incident light beam 176 is reflected by the surface of the substrate 120 to form a reflected light beam 178. At least a portion of the reflected light beam 178 is directed in a direction perpendicular to the substrate support surface 188 back through ceiling 103 to the light detector 170. The light detector 170 is configured to measure the intensity of the reflected light beam 178. A computer system 172 calculates portions of the real-time measured waveform spectra of reflected light beam 178 reflected from the beam spot 180 on substrate 120 and process the spectra by using advanced spectral analysis techniques including comparing the spectra with stored characteristic waveform patterns.

The light source 166 comprises a monochromatic or polychromatic light source that generates the incident light beam 176 used to illuminate the beam spot 180 on substrate 120. The intensity of the incident light beam 176 is selected to be sufficiently high enough to enable the reflected light beam 178 to have a measurable intensity. In one version, the light source 166, such as an Xe lamp, provides a polychromatic light and generates an emission spectrum of light in wavelengths from about 200 nm to about 800 nm. The polychromatic light source 166 can be filtered to select the frequencies comprising the incident light beam 176. Color filters can be placed in front of the light detector 170 to filter out all wavelengths except for the desired wavelength(s) of light, prior to measuring the intensity of the reflected light beam 178 entering the light detector 170. The light source 166 can also comprise a monochromatic light source, for example an He—Ne or ND-YAG laser, that provides a selected wavelength of light.

One or more focusing lenses 174*a*, 174*b* may be used to collimate the incident light beam 176 from the light source 166 to form the beam spot 180 on the substrate surface, and to focus the reflected light beam 178 back on the active surface of light detector 170. The size or area of the beam spot 180 should be sufficiently large to compensate for variations in surface topography of the substrate 120 and device design features. This enables detection of etch endpoints at target depth for design features having small openings, such as vias or narrow trenches, which may be densely present or more isolated. The area of the reflected light beam should be sufficiently large to activate a large portion of the active light-detecting surface of the light detector 170.

The incident and reflected light beams 176, 178 are directed through a transparent tilted window 182 of the processing chamber 100. The tilted window 182 allows the light beams 176, 178 to pass in and out of the processing environment of the processing chamber 100 substantially without producing internal reflections. The tilted window 182 comprises a substantially flat transparent panel 204. When the tilted window 182 is placed within the substantially flat, horizontal ceiling 103 of the processing chamber 102, the flat transparent panel 204 of the tilted window forms a first acute angle $\alpha$ between the transparent panel 204, the horizontal ceiling 103, the substrate support surface 188, and the substrate 120. The first acute angle may be in the range of 2° to 5°, preferably 3°. The substrate support surface 188 of the substrate support 116 on which the substrate 120 rests is disposed parallel to the ceiling 103 and perpendicular (90°) to the light beam 176, 178. Simultaneously, the panel 204 of the tilted window 182 forms a second acute angle $\beta$ relative to the light beams 176,178. In one embodiment, $\beta$ is in the range of 85° to 88°, preferably 87°. Accordingly, no internal reflections are produced reflecting from either an upper surface 207 of the panel 204 or a bottom surface 224 of the panel 204.

In an embodiment, the transparent panel 204 located in the ceiling 103 of the processing chamber 100, the panel 204 oriented at a first acute angle $\alpha$ relative to the substrate 120 and the substrate support 116, is configured to receive an incident light beam from the endpoint detection system 164 at a second acute angle $\beta$ relative to the panel 204. The panel 204 is further configured to transmit the incident light beam to the substrate 120 within the processing chamber 100 at an angle perpendicular to the substrate 120 and the substrate support 116. The panel 204 is further configured to receive a reflected light beam from the substrate 120 at the second acute angle. The panel 204 is further configured to transmit the reflected light beam to the endpoint detection system 164 at an angle perpendicular to the endpoint detection system 164.

The diameter of the beam spot 180 is generally about 2 mm to about 10 mm. However, if the beam spot 180 encompasses large isolated areas of the substrate containing only a small number of etched features, it may be necessary to use a smaller beam spot in order to focus on the features of interest. The size of the beam spot can therefore be optimized, depending on the design features for a particular device.

Optionally, a light beam positioner 184 may be used to move the incident light beam 176 across the substrate 120 to locate a suitable portion of the substrate surface on which to position the beam spot 180 to monitor an etching process. The light beam positioner 184 may include one or more primary mirrors 186 that rotate at small angles to deflect the light beam from the light source 166 onto different positions of the substrate surface. Additional secondary mirrors may be used (not shown) to intercept the reflected light beam 178 that is reflected from the substrate 120 surface and focus the reflected light beam 178 on the light detector 170. The light beam positioner 184 may also be used to scan the light beam in a raster pattern across the substrate 120 surface. In this version, the light beam positioner 184 comprises a scanning assembly consisting of a movable stage (not shown), upon which the light source 166, the collimating assembly 168 and the detector 170 are mounted. The movable stage can be moved through set intervals by a drive mechanism, such as a stepper motor, to move the beam spot 180 across the substrate 120 surface.

The light detector 170 comprises a light-sensitive electronic component, such as a charge coupled device (CCD), photodiode, or phototransistor, which provides a signal in response to a measured intensity of the reflected light beam 178 that is reflected from the substrate 120 surface. The signal can be in the form of a change in the level of a current passing through an electrical component or a change in a voltage applied across an electrical component. The reflected light beam 178 undergoes constructive and/or destructive interference which increases or decreases the intensity of the light beam, and the light detector 170 provides an electrical output signal in relation to the measured intensity of the reflected light beam 178. The electrical output signal is plotted as a function of time to provide waveform spectra having numerous waveform patterns corresponding to the varying intensity of the reflected light beam 178.

A computer program on the computer system 172 compares the shape of the measured waveform pattern of the reflected light beam 178 to a stored characteristic waveform pattern and determines the endpoint of the etching process when the measured waveform pattern is the same as the characteristic waveform pattern. As such, the period of interference signal as a function of time may be used to calculate the depth and etch rate. The program may also operate on the interference trends to detect a characteristic pattern, such as, an inflection point. The operations can be simple mathematic operations, such as evaluating a moving derivative to detect an inflection point.

Although the endpoint detection system 164 is positioned to interface with the substrate 120 through a portion of the substantially horizontal ceiling 103 of the processing chamber 100, the endpoint detection system 164 can, in some embodiments, be located horizontally above the chamber 100 and further include a folding mirror above the chamber 100 to bend the incident light beam 176 and the reflected light beam 178 from a vertical position to the horizontal position. The transparent tilted window 182 may be placed on a side of the chamber 100 or a bottom of the chamber 100.

Figure 2:
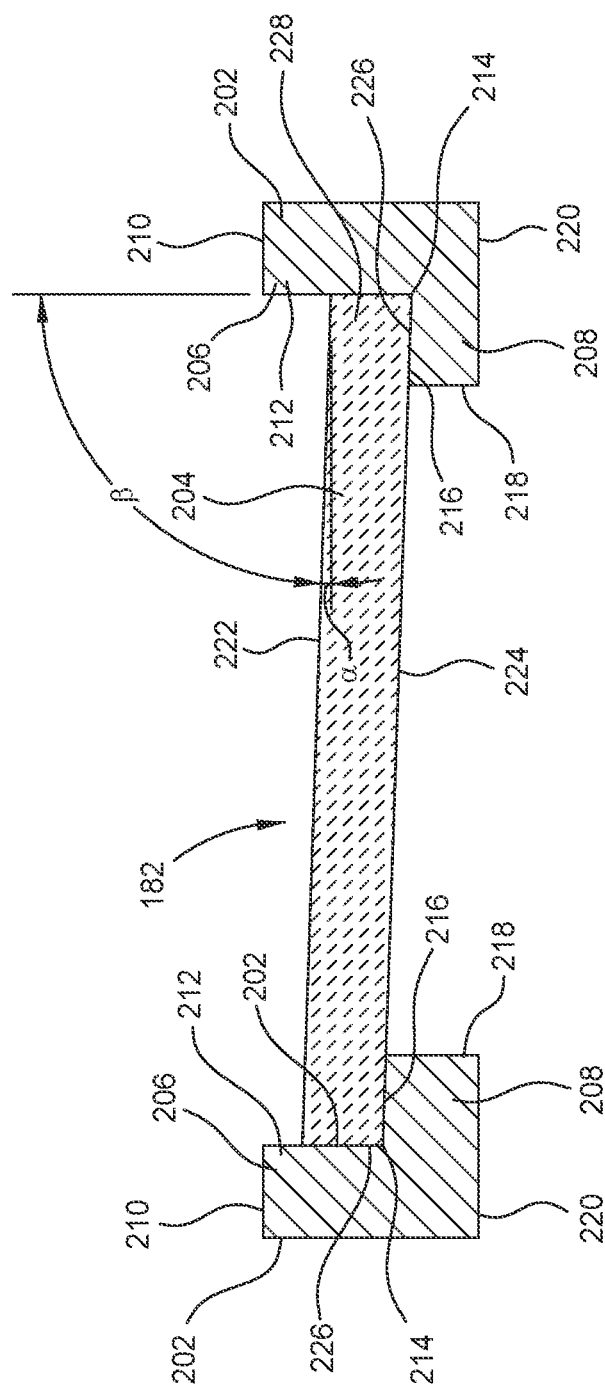
FIG. 2 is a side view of a tilted window employed in an endpoint detection system of the processing chamber, in accordance with embodiments of the present disclosure.

FIG. 2 is a side view of the tilted window 182 employed in the endpoint detection system 164 of the processing chamber 100. The tilted window 182 includes a mounting frame 202 and a panel 204 disposed in the mounting frame 202. The mounting frame 202 has a first section 206 and a second section 208 extending from the first section 206. The first section 206 has a substantially flat upper surface 210 and a sidewall 212 extending vertically to an intersection 214 with an upper surface 216 of the second section 208. The second section 208 has the upper surface 216, a substantially vertical sidewall 218, and a bottom surface 220 (forming the bottom surface 220 of the mounting frame 202).

The panel 204 has an upper surface 222 and a bottom surface 224. In one embodiment, the upper surface 222 is parallel to the bottom surface 224. The panel 204 also includes a near outer edge 226 and a far outer edge 228. In one embodiment, the near outer edge 226 and the far outer edge 228 are oriented at 90° angle relative to the upper surface 222 and the bottom surface 224. The panel 204 is configured to rest on the upper surface 216 of the second section 208 of the mounting frame 202. In one embodiment, the angle of the top surface 222 of the panel 204 relative to the upper surface 210 of the first section 206 of the mounting frame 202 is the acute angle α. In another embodiment, near outer edge 226 and the far outer edge 228 are oriented at the second acute angle β relative to the bottom surface 220 of the second section 208 of the mounting frame 202 to fit snugly against the sidewall 212 of the first section 206 and the upper surface 216 of the second section 208 of the mounting frame 202.

Figure 3:
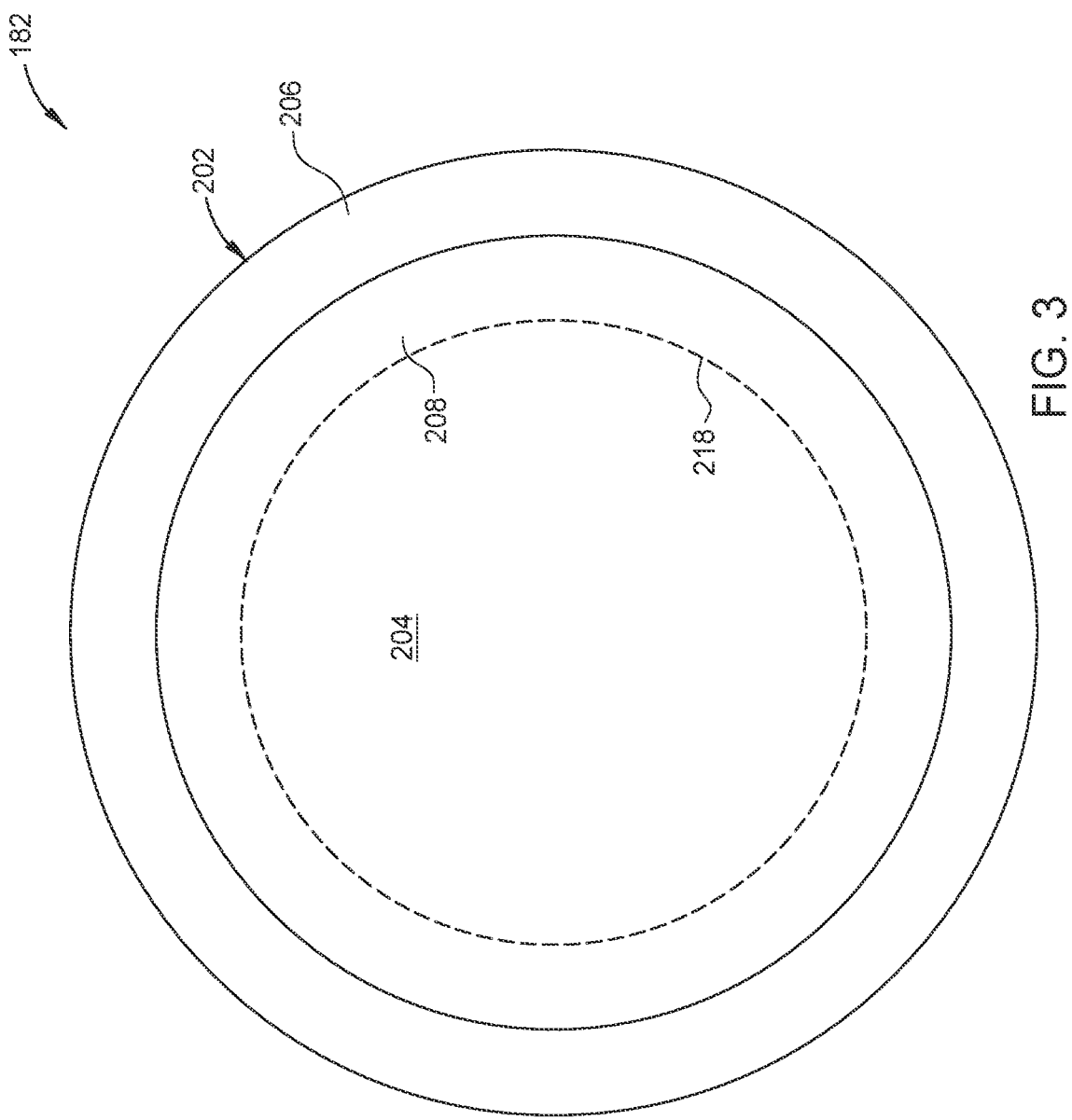
FIG. 3 is a top view of the tilted window of FIG. 2.

FIG. 3 is a top down view of the tilted window 182 of FIG. 2. In one embodiment, the panel 204 is substantially circular and forms a disk internal to the mounting frame 202. In other embodiments, the panel 204 may be substantially square, rectangular, triangular, or elliptical in shape, etc. In one embodiment, the panel 204 may be made of sapphire, fused silica, or MgF2. It is contemplated that other transparent materials may be used.

In one embodiment, the mounting frame 202 is substantially circular and forms an annular ring about the panel 204. In other embodiments, the mounting frame 202 may be substantially square, rectangular, triangular, or elliptical in shape, etc. In one embodiment, the mounting frame 202 may be made of metal or ceramic. It is contemplated that other transparent or non-transparent materials may be used. The material of the mounting frame 202 may be different from the material of the panel 204, but a one piece design promotes maintaining a vacuum seal between the mounting frame 202 and the panel 204.

Figure 4:
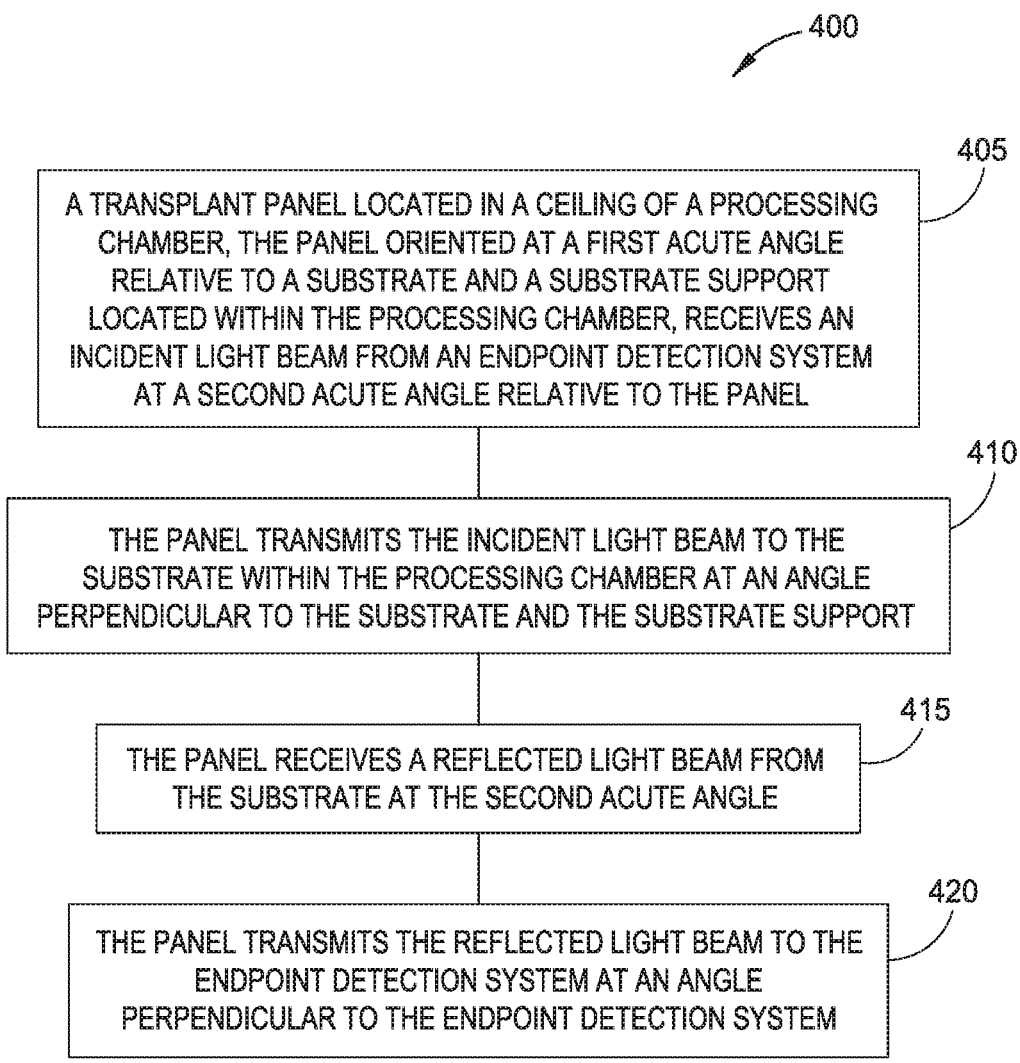
FIG. 4 is a method for operating an endpoint detection system of a processing system that employs the tilted window of FIGS. 1-3 suitable for use in an endpoint detection system of a processing chamber.

FIG. 4 is a method 400 for operating an endpoint detection system 164 of a processing chamber 100 that employs the tilted window 182 comprising the transparent panel 204 of FIGS. 1-3. The processing chamber 100 has a ceiling 103 formed therein, a substrate support 116 located internal to the processing chamber 100, and a substrate 120 resting on the substrate support 116. At block 405, the transparent panel 204 located in the ceiling 103 of the processing chamber 100, the panel 204 oriented at a first acute angle α relative to the substrate 120 and the substrate support 116, receives an incident light beam from the endpoint detection system 164 at a second acute angle β relative to the panel 204. At block 410, the panel 204 transmits the incident light beam to the substrate 120 within the processing chamber 100 at an angle perpendicular to the substrate 120 and the substrate support 116. At block 415, the panel 204 receives a reflected light beam from the substrate 120 at the second acute angle. At block 420, the panel 204 transmits the reflected light beam to the endpoint detection system 164 at an angle perpendicular to the endpoint detection system 164.

FIG. 5A depicts a plot of magnitude of reflections versus wavelength for a conventional window. FIG. 5B compares a plot of magnitude of reflections versus wavelength for a conventional window compared to the tilted window 182. The plot 502 is an indication of the magnitude of reflections from a conventional window and the plot 504 is an indication of the magnitude of reflections from the tilted window 182. There are almost no reflections from the angled window as compared to about 20K counts (counts is a unit of spectrometer output) for a conventional window. IEP spectra from a wafer with the angled window is composed of spectra reflected from the substrate only, without the 20$k$ counts background reflections are from the conventional IEP window. The tilted window 182 improves IEP modulation significantly.

Figure 6:
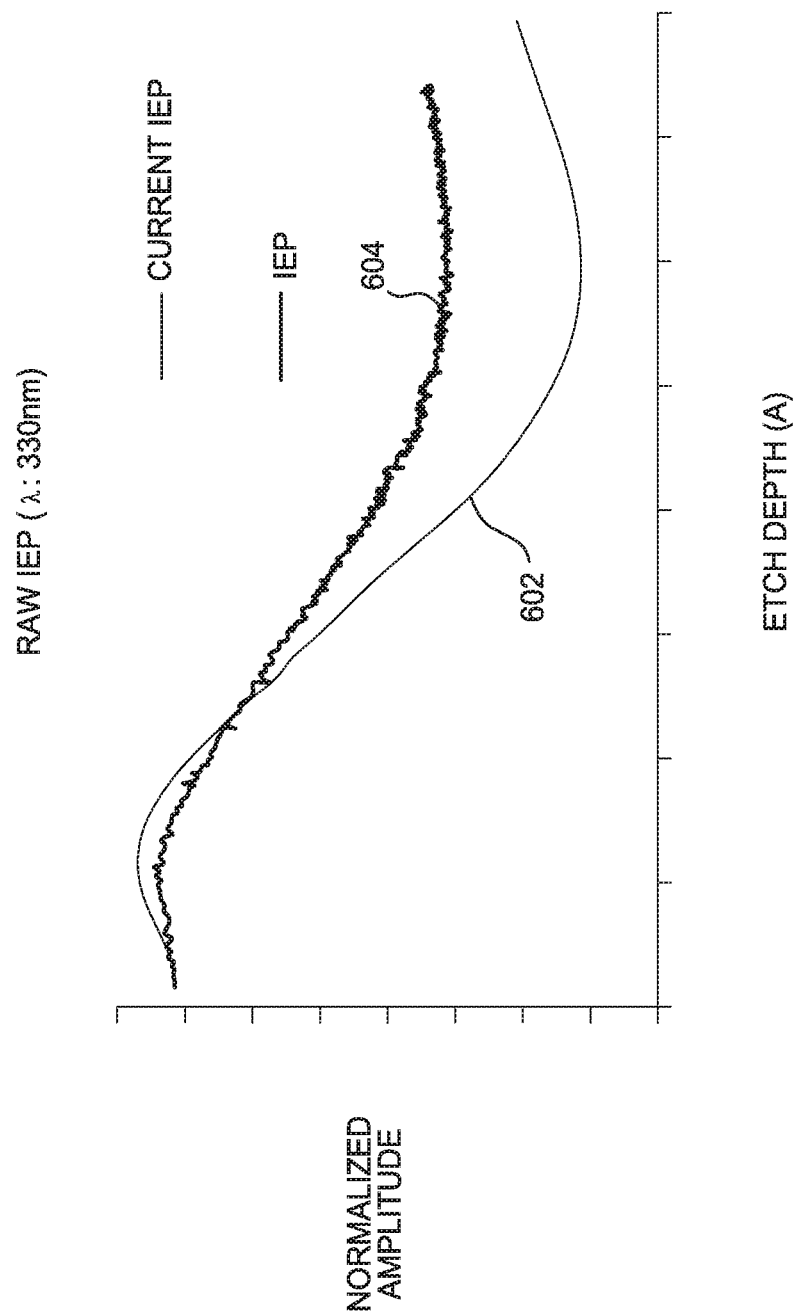
FIG. 6 depicts a plot of magnitude of normalized amplitude versus etch recess depth for the tilted window.

FIG. 6 depicts plots of magnitude of normalized amplitude versus etch recess depth for the tilted window (plot 602) and the conventional window (plot 604). The range of recess depth controlled by using an etch IEP algorithm with the angled window can be reduced by ~10 Å based on lab test results on WEB (WEB stand for W (tungsten) etch back) chips. Etch depth variation within 5 Å~20 Å can be achieved using the angled window.

Figure 7A:
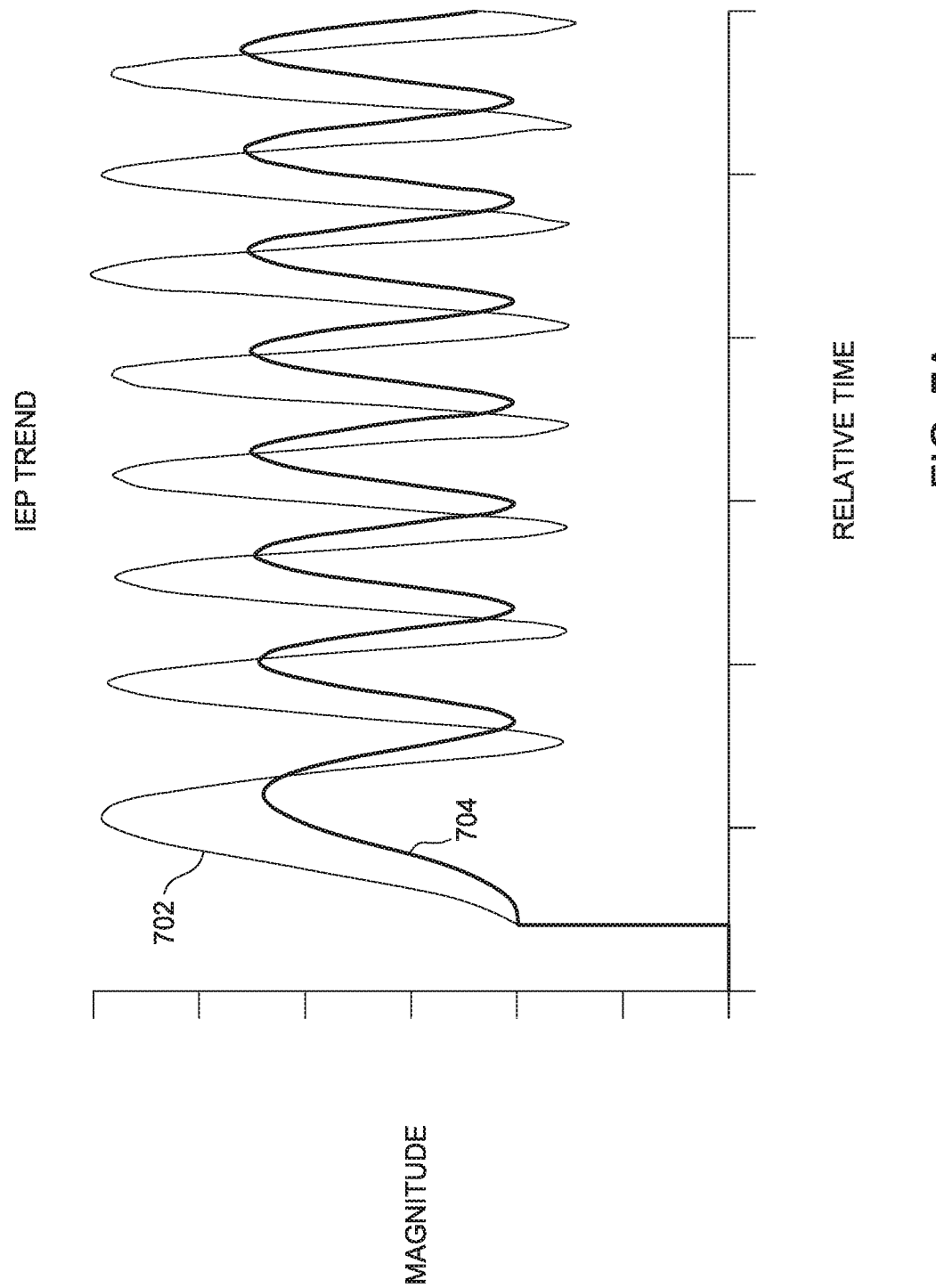
FIG. 7A depicts plots of magnitude versus relative time of fringe curve spectra from the angled window versus a conventional window.
Figure 7B:
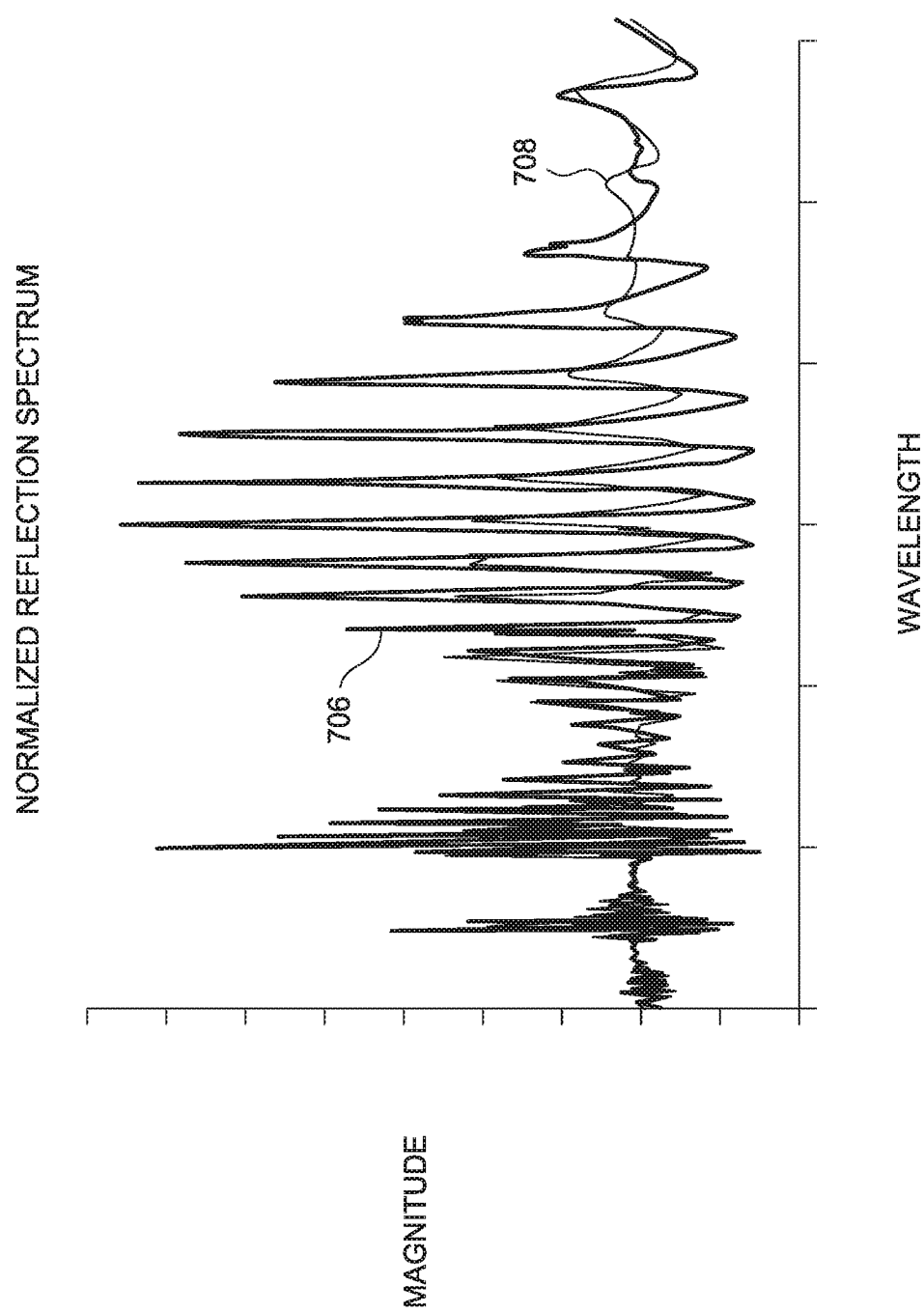
FIG. 7B depicts plots of magnitude versus wavelength of fringe curve spectra from the angled window versus a conventional window.

FIG. 7A depicts plots of magnitude versus relative time of fringe curve spectra from the angled window (plot 702) versus a conventional window (plot 704). FIG. 7B depicts plots of magnitude versus wavelength of fringe curve spectra from the angled window plot 706 versus a conventional window plot 708. As can be seen from the plots, IEP modulation depth (sensitivity) is increased by about 80% for the conventional window plots 704, 706 versus the angled window plots 704, 708. This is desired because spectral analysis is relied on to calculate the on wafer metric (dimension of features at the wafer surface) and the stronger the spectral response to subtle on wafer metric change, the higher the signal to noise ratio is and more accurate results are obtained of the on wafer metric.

While the foregoing is directed to embodiments of the present disclosure, other and further embodiments of the disclosure may be devised without departing from the basic scope thereof, and the scope thereof is determined by the claims that follow.

What is claimed is:

1. A method for operating an endpoint detection system of an etch processing chamber having a ceiling formed therein, a substantially circular mounting frame having a body comprising a first section and a second section extending perpendicular from the first section, the second section having an upper surface and a bottom surface, the upper surface of the second section tilted at a first acute angle relative to the bottom surface of the second section and tilted at a second acute angle relative to the first section; and a substrate support located internal to the etch processing chamber, and a substrate resting on the substrate support, comprising:
    receiving, by a transparent panel located in the ceiling of the etch processing chamber, the transparent panel oriented at the first acute angle relative to the substrate and the substrate support, an incident light beam from the endpoint detection system at the second acute angle relative to the transparent panel, wherein the transparent panel comprises:
        a body comprising a top surface, a bottom surface, and a sidewall, the transparent panel disposed in the substantially circular mounting frame, the sidewall of the transparent panel adjacent to the first section of the substantially circular mounting frame and the bottom surface of the transparent panel resting on the upper surface of the second section of the substantially circular mounting frame oriented at the first acute angle relative to the bottom surface of the second section of the substantially circular mounting frame, the substantially circular mounting frame forming an annular ring around the transparent panel, the substantially circular mounting frame and the transparent panel configured to maintain a vacuum seal between the substantially circular mounting frame and the transparent panel, the substantially circular mounting frame exposing a center of the transparent panel, wherein the center is coaxial with a radial center of inner sidewalls of the first section of the mounting frame; and
    transmitting, by the transparent panel, the incident light beam to the substrate within the etch processing chamber at an angle perpendicular to the substrate and the substrate support;
    receiving, at a light detector, a reflected light beam having an intensity corresponding to a dimension of an opening in the substrate, the dimension including a target depth; and
    calculating the dimension, including the target depth, and an etch rate based upon a waveform spectra of the reflected light beam, the waveform spectra corresponding to the intensity.

2. The method of claim 1, further comprising:
    receiving, by the transparent panel, the reflected light beam from the substrate at the second acute angle; and
    transmitting, by the transparent panel, the reflected light beam to the endpoint detection system at an angle perpendicular to the endpoint detection system.

3. The method of claim 2, wherein the transparent panel produces than 20,000 counts of background reflections from the substrate within the incident light beam or the reflected light beam.

4. The method of claim 1, wherein the second acute angle is equal to 90° minus the first acute angle.

5. The method of claim 1, wherein the first acute angle is 3° and the second acute angle is 87°.

6. An etch processing chamber, comprising:
    a chamber body having sidewalls and a bottom;
    a ceiling mounted overlying the chamber body, the ceiling and the chamber body defining an inner space of the etch processing chamber;
    a substrate support disposed in the inner space of the etch processing chamber and configured to support a substrate during processing;
    an endpoint detection system;
    a substantially circular mounting frame having a body comprising a first section and a second section extending perpendicular from the first section, the second section having an upper surface and a bottom surface, the upper surface of the second section tilted at a first acute angle relative to the bottom surface of the second section and tilted at a second acute angle relative to the first section; and
    a transparent panel mounted in the ceiling and configured to allow the endpoint detection system to interface with the substrate through the transparent panel, the transparent panel oriented at the first acute angle relative to the substrate and the substrate support, the transparent panel comprises:
        a body comprising a top surface, a bottom surface, and a sidewall, the transparent panel disposed in the substantially circular mounting frame, the sidewall of the transparent panel adjacent to the first section of the substantially circular mounting frame and the bottom surface of the transparent panel resting on the upper surface of the second section of the substantially circular mounting frame oriented at the first acute angle relative to the bottom surface of the second section of the substantially circular mounting frame, the substantially circular mounting frame forming an annular ring around the transparent panel, the substantially circular mounting frame and the transparent panel configured to maintain a vacuum seal between the substantially circular mounting frame and the transparent panel, the substantially circular mounting frame exposing a center of the transparent panel, wherein the center is coaxial with a radial center of inner sidewalls of the first section of the mounting frame, the transparent panel configured to:
receive an incident light beam from the endpoint detection system at the second acute angle relative to the transparent panel, the upper surface of the second section tilted of the transparent panel tilted at the second acute angle relative to the first section; and
transmit the incident light beam to the substrate within the etch processing chamber at an angle perpendicular to the substrate and the substrate support; and the endpoint detection system configured to:
receive, at a light detector, a reflected light beam having an intensity corresponding to a dimension of an opening in the substrate, the dimension including a target depth; and
calculate, with a computer system, the dimension, including the target depth, and an etch rate based upon a waveform spectrum of the reflected light beam, the waveform spectra corresponding to the intensity.

7. The etch processing chamber of claim 6, wherein the transparent panel is further configured to:
receive a reflected light beam from the substrate at the second acute angle; and
transmit the reflected light beam to the endpoint detection system at an angle perpendicular to the endpoint detection system.

8. The etch processing chamber of claim 6, wherein the second acute angle is equal to 90° minus the first acute angle.

9. The etch processing chamber of claim 6, wherein the first acute angle is 3° and the second acute angle is 87°.

* * * * *